United States Patent
Li et al.

(10) Patent No.: US 10,989,187 B2
(45) Date of Patent: Apr. 27, 2021

(54) CONTROL SYSTEM AND CONTROL METHOD

(71) Applicant: Hangzhou Sanhua Research Institute Co., Ltd., Zhejiang (CN)

(72) Inventors: Shuang Li, Zhejiang (CN); Hongtao Zhang, Zhejiang (CN); Lulu Zhang, Zhejiang (CN); Wei Ye, Zhejiang (CN); Bin Zhang, Zhejiang (CN)

(73) Assignee: Hangzhou Sanhua Research Institute Co., Ltd., Zhejiang (CN)

( * ) Notice: Subject to any disclaimer, the term of this patent is extended or adjusted under 35 U.S.C. 154(b) by 3 days.

(21) Appl. No.: 16/348,140

(22) PCT Filed: Jul. 17, 2017

(86) PCT No.: PCT/CN2017/093155
§ 371 (c)(1),
(2) Date: May 7, 2019

(87) PCT Pub. No.: WO2018/090655
PCT Pub. Date: May 24, 2018

(65) Prior Publication Data
US 2019/0264678 A1  Aug. 29, 2019

(30) Foreign Application Priority Data

Nov. 17, 2016 (CN) .......................... 201611009708.9
Nov. 17, 2016 (CN) .......................... 201611010014.7
Nov. 17, 2016 (CN) .......................... 201611010424.1

(51) Int. Cl.
*G01M 15/06* (2006.01)
*F04B 49/06* (2006.01)
(Continued)

(52) U.S. Cl.
CPC ............ *F04B 49/065* (2013.01); *F04B 49/06* (2013.01); *G01R 19/16533* (2013.01);
(Continued)

(58) Field of Classification Search
CPC .............. F04B 49/06; G01R 19/16533; G05B 19/4142
See application file for complete search history.

(56) References Cited

U.S. PATENT DOCUMENTS

2004/0075463 A1  4/2004  Cranford, Jr. et al.
2009/0027022 A1  1/2009  Oyama et al.
(Continued)

FOREIGN PATENT DOCUMENTS

AU    7106687 A    1/1988
CN    1411012 A    4/2003
(Continued)

OTHER PUBLICATIONS

International Search Report and Written Opinion for International Application No. PCT/CN2017/093155, dated Oct. 17, 2017.
(Continued)

*Primary Examiner* — Muhammad S Islam
(74) *Attorney, Agent, or Firm* — Wolf, Greenfield & Sacks, P.C.

(57) ABSTRACT

A control system for controlling operation of an execution device is provided. The control system includes a master controller, a microprocessor, and a signal line. The master controller is configured to send a control signal to the microprocessor via the signal line. The microprocessor is configured to send the control signal to the execution device to drive the execution device to operate, acquire, at a time interval, a feedback signal representing an operation state of the execution device, and send the feedback signal to the signal line. The master controller is further configured to
(Continued)

acquire the feedback signal from the signal line, determine, from the feedback signal, the operation state of the execution device, and regulate the control signal based on the operation state.

18 Claims, 8 Drawing Sheets

(51) Int. Cl.
  *G01R 19/165* (2006.01)
  *G05B 19/414* (2006.01)
(52) U.S. Cl.
  CPC .. *G05B 19/4142* (2013.01); *F04B 2203/0202* (2013.01); *F04B 2203/0205* (2013.01)

(56) References Cited

U.S. PATENT DOCUMENTS

| | | | | |
|---|---|---|---|---|
| 2009/0071735 | A1* | 3/2009 | Kaneko | B60K 6/52 180/65.285 |
| 2010/0215511 | A1* | 8/2010 | Eller | F04B 49/02 417/44.1 |
| 2014/0090723 | A1 | 4/2014 | Toale et al. | |
| 2015/0025828 | A1* | 1/2015 | Wang | B60L 3/0038 702/104 |
| 2015/0311848 | A1 | 10/2015 | Maruyama et al. | |
| 2016/0134214 | A1 | 5/2016 | Nakao et al. | |
| 2016/0204831 | A1 | 7/2016 | Isoda et al. | |
| 2017/0292898 | A1* | 10/2017 | Schweikert | F02D 41/009 |

FOREIGN PATENT DOCUMENTS

| | | | |
|---|---|---|---|
| CN | 101355300 | A | 1/2009 |
| CN | 101877597 | A | 11/2010 |
| CN | 102374328 | A | 3/2012 |
| CN | 102777367 | A | 11/2012 |
| CN | 202995400 | U | 6/2013 |
| CN | 203018889 | U | 6/2013 |
| CN | 103195745 | A | 7/2013 |
| CN | 103309752 | A | 9/2013 |
| CN | 103873030 | A | 6/2014 |
| CN | 103963724 | A | 8/2014 |
| CN | 203783862 | U | 8/2014 |
| CN | 104038138 | A | 9/2014 |
| CN | 204304856 | U | 4/2015 |
| CN | 204450545 | U | 7/2015 |
| CN | 204458290 | U | 7/2015 |
| CN | 105048906 | A | 11/2015 |
| CN | 204827729 | U | 12/2015 |
| CN | 105281627 | A | 1/2016 |
| CN | 105324932 | A | 2/2016 |
| CN | 105594152 | A | 5/2016 |
| CN | 105974252 | A | 9/2016 |
| CN | 106093562 | A | 11/2016 |
| CN | 108073101 | A | 5/2018 |
| CN | 108073103 | A | 5/2018 |
| EP | 0 809 164 | A1 | 11/1997 |
| KR | 2010-0125562 | A | 12/2010 |
| WO | WO 95/09305 | A1 | 4/1995 |
| WO | WO 2008/087153 | A1 | 7/2008 |
| WO | WO 2009/024769 | A2 | 2/2009 |
| WO | WO 2013/061461 | A1 | 5/2013 |
| WO | WO 2015/042332 | A2 | 3/2015 |
| WO | WO 2015/042332 | A3 | 3/2015 |

OTHER PUBLICATIONS

Extended European Search Report for European Application No. 17870917.6, dated May 13, 2020.
CN201611010014.7, Jun. 23, 2020, First Office Action.
CN201611009708.9, Jun. 28, 2020, First Office Action.
CN201611010424.1, Jun. 28, 2020, First Office Action.
First Office Action for Chinese Application No. 201611009708.9, dated Jun. 28, 2020.
First Office Action for Chinese Application No. 201611010014.7, dated Jun. 23, 2020.
First Office Action for Chinese Application No. 201611010424.1, dated Jun. 28, 2020.

* cited by examiner

CONTROL SYSTEM AND CONTROL METHOD

This application is a national stage filing under 35 U.S.C. 371 of International Patent Application Serial No. PCT/CN2017/093155, filed Jul. 17, 2017, which claims priority to Chinese Patent Application No. 201611009708.9, titled "COMMUNICATION CONTROL SYSTEM", filed on Nov. 17, 2016 with the Chinese Patent Office, priority to Chinese Patent Application No. 201611010424.1, titled "COMMUNICATION CONTROL SYSTEM", filed on Nov. 17, 2016 with the Chinese Patent Office, and priority to Chinese Patent Application No. 201611010014.7, titled "COMMUNICATION METHOD OF COMMUNICATION SYSTEM AND COMMUNICATION CONTROL SYSTEM", filed on Nov. 17, 2016 with the Chinese Patent Office. The entire contents of these applications are incorporated herein by reference in their entireties.

FIELD

The present disclosure relates to a control system, and in particular to a control system and a control method for controlling communications.

BACKGROUND

At present, electric pumps are generally applied in the refrigeration cycle of vehicles. A control system controls the electric pump to operate. The electric pump includes a motor and a rotor. The motor drives the rotor to rotate, and a control system of the electric pump controls the motor to rotate. The control system of the electric pump includes a master controller, a microprocessor and a communication system. The master controller sends a control signal to the microprocessor via the communication system. The microprocessor analyzes the control signal, so as to control the motor to rotate. The microprocessor feeds back the operation state of the electric pump to the master controller via the communication system.

Generally, the master controller is a controller of a vehicle. The microprocessor is integrated in a printed circuit board of the electric pump. Control signals and feedback signals are transmitted between the master controller and the microprocessor via the communication system. The communication system processes communication protocols between the master controller and the microprocessor. In order to prevent mutual interference between signals, the control signal and the feedback signal are transmitted through separated signal lines, which results in a complex connection of the control system.

Therefore, it is desired to improve the conventional technology, so as to solve the above technical problems.

SUMMARY

The present disclosure aims to provide a control system and a control method to achieve a simple system connection and an accurate control.

The following technical solutions are provided according to an embodiment of the present disclosure. There is provided a control system for controlling operation of an execution device. The control system includes a master controller, a microprocessor and a signal line. The master controller is configured to send a control signal to the microprocessor via the signal line. The microprocessor is configured to send the control signal to the execution device to drive the execution device to operate, acquire, at a time interval, a feedback signal representing an operation state of the execution device, and send the feedback signal to the signal line. The master controller is further configured to acquire the feedback signal from the signal line; determine, from the feedback signal, the operation state of the execution device; and regulate the control signal based on the operation state.

A control method performed by a control system is further provided according to an embodiment of the present disclosure. The control system includes a master controller and a microprocessor. The control method includes: sending, by the master controller, a control signal of PWM waveform with a duty cycle, where the duty cycle corresponds to a target rotating speed of the execution device; receiving the control signal and analyzing the control signal by the microprocessor, and generating a drive signal to drive the execution device to operate. The control method further includes an event processing step, where an event list is prestored. The event list includes multiple pieces of event information representing event states. The control method further includes: acquiring, by the microprocessor, at a time interval, a current operation state of the execution device; determining, by the microprocessor, whether the current operation state of the execution device is consistent with the event state corresponding to a piece of event information in the prestored event list; and enabling or disabling, by the microprocessor, the piece of event information in the prestored event list and sending a feedback signal to the master controller.

In the present disclosure, the master controller is connected to the microprocessor via a single signal line. The microprocessor includes a communication module and a control module. The master controller sends the control signal to the communication module via the signal line. The control module acquires feedback information, and sends the feedback information to the signal line via the communication module. The master controller acquires the feedback information from the signal line. In this way, interface terminals of the system are reduced, leading to a simple structure. With the feedback system, the control is performed more timely and more accurately.

DETAILED DESCRIPTION OF EMBODIMENTS

Hereinafter, the technical solution is further described in combination with the drawings and specific embodiments.

The electric pump in an embodiment is applied to a vehicle thermal management system. The electric pump includes a motor. The control system controls operation of the motor so as to control operation of the electric pump. The control system includes a master controller ECU, a microprocessor MCU and a signal line BUS. The master controller ECU sends a control signal to the microprocessor MCU via the signal line BUS. The microprocessor MCU sends the control signal to the electric pump. The microprocessor MCU acquires, at a time interval, a feedback signal representing an operation state of the electric pump and sends the feedback signal to the signal line BUS. The master controller ECU acquires the feedback signal from the signal line BUS. The master controller ECU determines, from the feedback signal, the operation state of the electric pump, and regulates the control signal based on the operation state.

Figure 1:
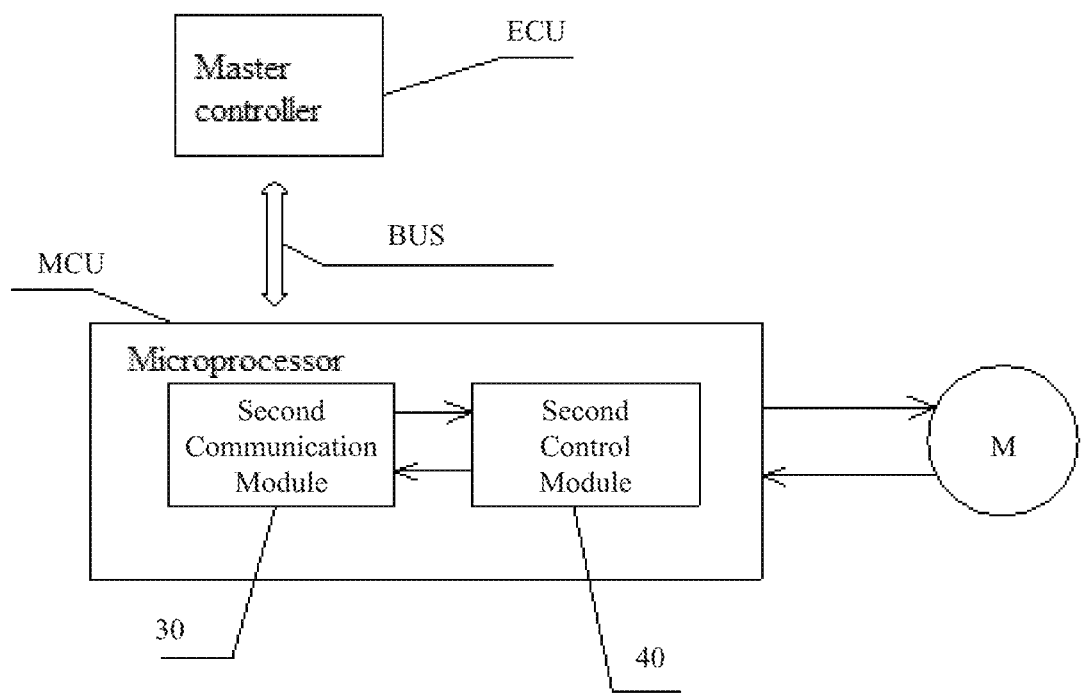
FIG. 1 is a schematic block diagram showing a control system.
Figure 2:
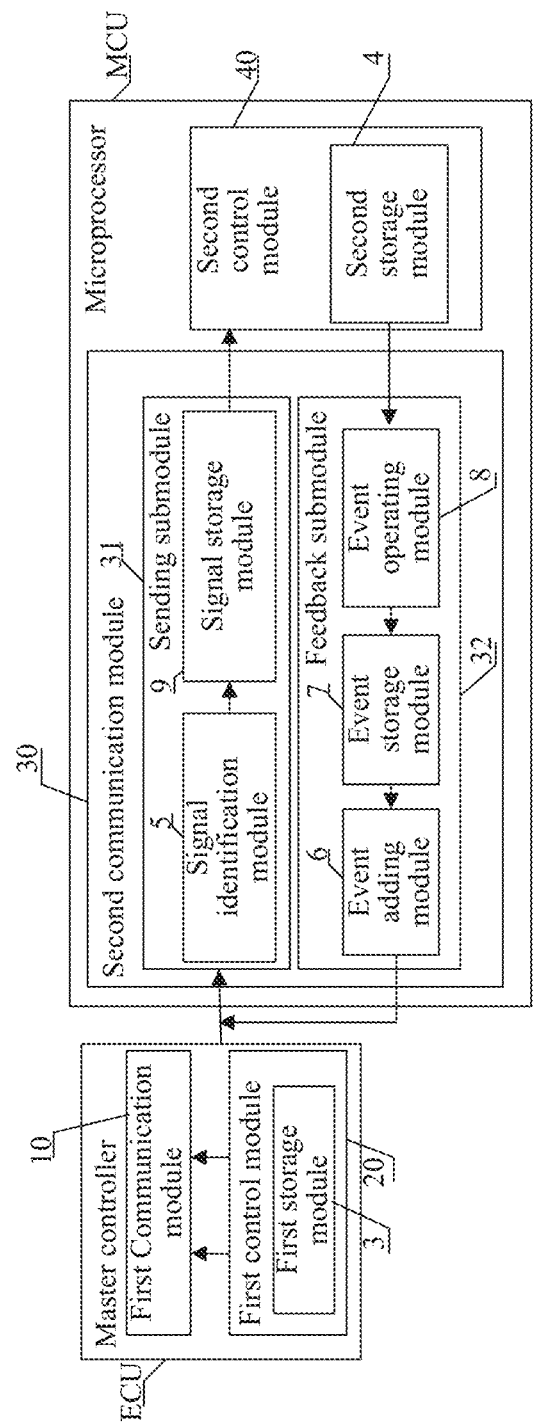
FIG. 2 is a schematic block diagram showing a master controller and a microcontroller shown in FIG. 1.

Referring to FIGS. 1 and 2, the master controller ECU includes a first communication module 10 and a first control module 20. The microprocessor MCU includes a second communication module 30 and a second control module 40. The master controller ECU sends the control signal to the second communication module 30 via the signal line BUS, the second communication module 30 converts the control signal into a first control signal. The second control module 40 acquires the first control signal, and converts the first control signal into a second control signal. The second control module 40 sends the second control signal to the electric pump. The second control module 40 acquires, at a time interval, a first feedback signal representing the operation state of the electric pump, and converts the first feedback signal into a second feedback signal. The second feedback signal is sent to the second communication module 30 and converted into a third feedback signal. The third feedback signal is sent to the signal line BUS. The master controller ECU acquires the third feedback signal. The master controller ECU determines, from the third feedback signal, the operation state of the electric pump, and regulates the control signal based on the operation state. In this way, the signal is sent and fed back between the microprocessor MCU and the master controller ECU via a single signal line BUS. Therefore, interface terminals of the control system are reduced, leading to a simple structure. With the feedback system, the master controller can control the execution device more timely and more accurately.

In this embodiment, the execution device is the electric pump. In fact, the execution device may be other electronic components including motors, such as an electronic expansion valve or an electronic water valve. The motor in this embodiment includes a stator assembly and a rotor assembly. The feedback signal can be obtained by detecting the stator assembly and/or the rotor assembly or obtained from the stator assembly and/or the rotor assembly.

Reference is made to FIG. 2. In this embodiment, the third feedback signal is in a form of a combination of a duration of the current control signal and a duration of a low level signal. The first control module 20 includes a first storage module 3. The first storage module 3 prestores multiple combinations of the duration of the control signal representing the operation state of the electric pump and the duration of the low level signal, which form a combination list. The master controller ECU compares the third feedback signal acquired by the master controller ECU with the combinations in the combination list prestored in the first storage module 3, to determine the current operation state of the electric pump. In this way of forming the third feedback signal as the combination of the duration of the control signal and the duration of the low level signal, it is advantageous to improve generality and portability of the control system and the microprocessor.

The operation state of the electric pump includes a normal state and an event state. The normal state indicates that the electric pump operates following the control signal sent by the master controller ECU. The event state indicates that the electric pump operates not following the control signal sent by the master controller ECU.

In this embodiment, the second control module 40 acquires the first feedback signal. The second control module 40 includes a second storage module 4. The second storage module 4 prestores operation states. The second control module acquires the first feedback signal representing the current operation state. In a case that the current operation state is same as one of the prestored operation states, the current operation state of the execution device is determined as the prestored operation state and the second feedback signal including the event information is generated. The first feedback signal includes an operating current of the motor. The microprocessor MCU acquires the operating current and determines, based on the operating current, the operation state of the execution device. In this case, the operation state of the detected execution device includes an overcurrent state, a stalled state, a dry-running state and other event states. The first feedback signal further includes three-phase voltages of the motor. The microprocessor MCU acquires the three-phase voltages of the motor, and determines whether the execution device is in an overvoltage state, an under-voltage state, or other event states. The first feedback signal further includes a voltage of an NTC (Negative Temperature Coefficient) thermistor. The microprocessor MCU acquires the voltage of the NTC thermistor, and determines whether the execution device is in an over-temperature state or other event states. The second control module 40 determines the current operation state of the electric pump from the acquired feedback signal, generates the second feedback signal. The second feedback signal is sent to the second communication module to generate the third feedback signal. The master controller ECU acquires the third feedback signal and generates the control signal corresponding to the current operation state of the execution device in response to the third feedback signal, so as to control the operation state of the execution device.

The third feedback signal is in a form of the combination of the duration of the current control signal from the signal line BUS and the duration of the low level signal, to represent the operation state of the execution device. For example, in a case that the third feedback signal is a combination of the duration of 4.5 s of the current control signal and the duration of 0.5 s of the pull-down level signal, the operation state of the execution device is the normal state. In a case that the third feedback signal is a combination of the duration of 1.5 s of the current control signal and the duration of 1 s of the pull-down level signal, the operation state of the execution device is the stalled state. In a case that the third feedback signal is a combination of the duration of is of the current control signal and the duration of 1 s of the pull-down level signal, the operation state of the execution device is the dry-running state. In a case that the third feedback signal is a combination of the duration of 2 s of the current control signal and the duration of 1 s of the pull-down level signal, the operation state of the execution device is the over-temperature state. In a case that the third feedback signal is a combination of the duration of 3 s of the current control signal and the duration of 1 s of the pull-down level signal, the operation state of the execution device is the overcurrent state. In a case that the third feedback signal is a combination of the duration of 2.5 s of the current control signal and the duration of 1 s of the pull-down level signal, the operation state of the execution device is the under-voltage state or the over-voltage state.

Figure 3:
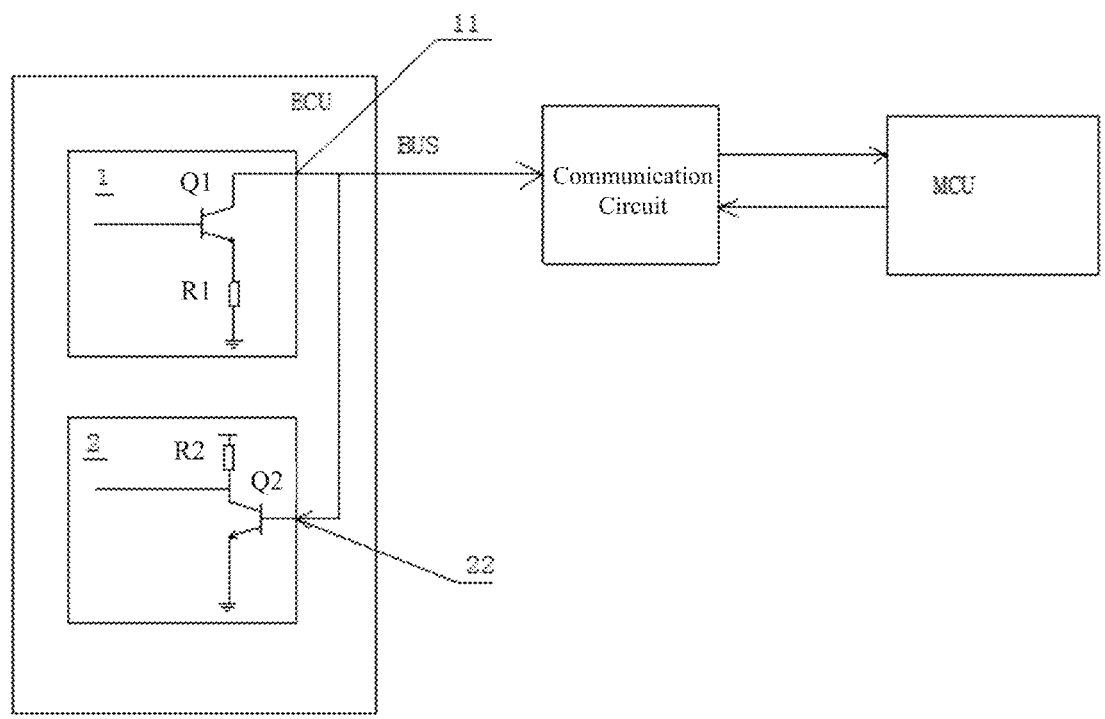
FIG. 3 is a schematic block diagram showing communication between the master controller and the microprocessor shown in FIG. 1 via a communication circuit.

Referring to FIG. 3, the master controller ECU includes an output unit 1 and an input unit 2. The master controller ECU outputs the control signal via the output unit 1, to the signal line BUS. The master controller ECU acquires the third feedback signal from the signal line BUS via the input unit 2.

The output unit 1 includes an output interface 11 and an output circuit. The input unit 2 includes an input interface 22 and an input circuit. The output circuit includes a first transistor Q1. A base of the first transistor Q1 serves as an input electrode for the control signal. An emitter of the first transistor Q1 is grounded via a first resistor R1. A collector of the first transistor Q1 is connected to the output interface 11. The output circuit with this configuration is advantageous to improve the drive capability of the control signal. The input circuit includes a second transistor Q2. A base of the second transistor Q2 is connected to the input interface 22. The master controller ECU acquires the third feedback signal via the input interface 22. An emitter of the second transistor Q2 is grounded. A collector of the second transistor Q2 is connected to a power supply via a second resistor R2. The configuration of second resistor R2 is advantageous to pull up a voltage of the collector of the second transistor Q2.

The control system includes a sending system and a feedback system. The control signal controls the operation of the electric pump via the sending system. The feedback signal is fed back to the master controller via the feedback system.

Referring to FIG. 2, the second communication module 30 includes a sending submodule 31 and a feedback submodule 32. The sending submodule 31 includes a signal identification module 5 and a signal storage module 9. The feedback submodule 32 includes an event adding module 6 and an event storage module 7. The sending submodule is a part of the sending system. The feedback submodule is a part of the feedback system.

The signal identification module 5 is configured to: receive the control signal from the master controller ECU; and determine whether the received control signal is a signal of a PWM (Pulse Width Modulation) waveform. In a case that the control signal is not a signal of a PWM waveform, the control signal is an abnormal signal. In this case, a value is assigned for the abnormal signal and the feedback system does not operate. The microprocessor MCU generates a first control signal to drive the motor to operate at a maximum rotating speed. In a case that the control signal is a signal of a PWM waveform, the signal identification module 5 analyzes the control signal to obtain a duty cycle and frequency of the control signal. The duty cycle is a percent of the duration of the high level of the control signal in a period of the control signal. The frequency is the number of periodic changes of the control signal per unit of time. It is determined whether the duty cycle and the frequency of the control signal are both correct. In a case that both of the duty cycle and the frequency of the PWM signal is correct, the control signal is stored in the signal storage module 9, so as to be acquired by the second control module 40.

The duty cycle being incorrect includes the duty cycle being a 0 duty cycle, a 100% duty cycle and an error duty cycle. The 0 duty cycle indicates that the control signal is always in a low level state. The 100% duty cycle indicates that the control signal is always in a high level state. The error duty cycle includes a case that in 6 successive control signals inputted to the second communication module, a difference between a maximum of the duty cycle and a minimum of the duty cycle is greater than 1%, and a duration of this situation is greater than or equal to 2 s, and a case that in 6 successive control signals inputted to the second communication module, a difference between the maximum of the duty cycle and a minimum of the duty cycle is greater than 1%, and a duration of this situation is greater than is and equal to or less than 2 s. In the case that the duty cycle is 0 or 100% or the case that the difference between the maximum of the duty cycle and the minimum of the duty cycle is greater than 1% and a duration of this situation is greater than or equal to 2 s, the control signal is an abnormal signal. In this case, a value is assigned for the abnormal signal, and the feedback system does not operate. The second communication module generates the first control signal to drive the motor to operate at the maximum rotating speed. The first control signal is stored in the signal storage module 9, so as to be acquired by the second control module. In the case that in 6 successive control signals inputted to the second communication module, a difference between the maximum of the duty cycle and the minimum of the duty cycle is greater than 1%, and a duration of this situation is greater than 1s and equal to or less than 2 s, the control signal is the abnormal signal. In this case, a value is assigned for the abnormal signal, and the feedback system does not operate. The second communication module 30 generates the first control signal to drive the motor to operate at the rotating speed corresponding to the previous control signal. The first control signal is stored in the signal storage module 9, so as to be acquired by the second control module 40.

The frequency being incorrect includes a case that in 6 successive control signals inputted to the second communication module, a ratio of the difference between a maximum of the frequency and a minimum of the frequency to the maximum of the frequency is greater than 1%, and a duration of this situation is greater than or equal to 2 s. In a case that the frequency of the control signal is incorrect, the control signal is an abnormal signal. In this case, a value is assigned for the abnormal signal and the feedback system does not operate. The second communication module generates the first control signal to drive the motor to operate at the maximum rotating speed. The first control signal is stored in the signal storage module 9, so as to be acquired by the second control module.

The feedback submodule 32 includes the event adding module 6 and the event storage module 7. The event adding module 6 is configured to add the event information. The added event information forms an event list and is stored in the event storage module 7, such that the event storage module 7 prestores the event list. The feedback submodule 32 further includes an event operating module 8. The event operating module 8 is configured to receive the second feedback signal and acquire current event information included in the second feedback signal. In a case that the current event information is same as one of the event information in the event list, the event information is determined to be reported or not reported, and a corresponding third feedback signal is generated.

The event information includes an event number, a priority, an enable bit, a minimum times of reporting, a duration of the control signal, and a duration of a pull-down voltage. The event number indicates a number assigned to the operation state of the execution device represented by the second feedback signal. For example, the normal state is numbered by 1, the stalled state is numbered by 2, the dry-running state is numbered by 3, the over-voltage state is numbered by 4, and the under-voltage state is numbered by 5. In a case that multiple second feedback signals occur, a second feedback signal having a highest priority is firstly used to generate the third feedback signal. In a case that the enable bit of the event information is 1, the event information is reported, and in a case that the enable bit of the event information is 0, the event information is not reported. The minimum times of reporting indicates, for each generated second feedback signal, the number of times of the third feedback signal being generated and sent to the signal line. The duration of the control signal indicates, in the feedback system, a length of time for which the control signal lasts in the signal line. The duration of the pull-down voltage indicates a length of time for which the pull-down voltage lasts in the signal line.

Figure 4:
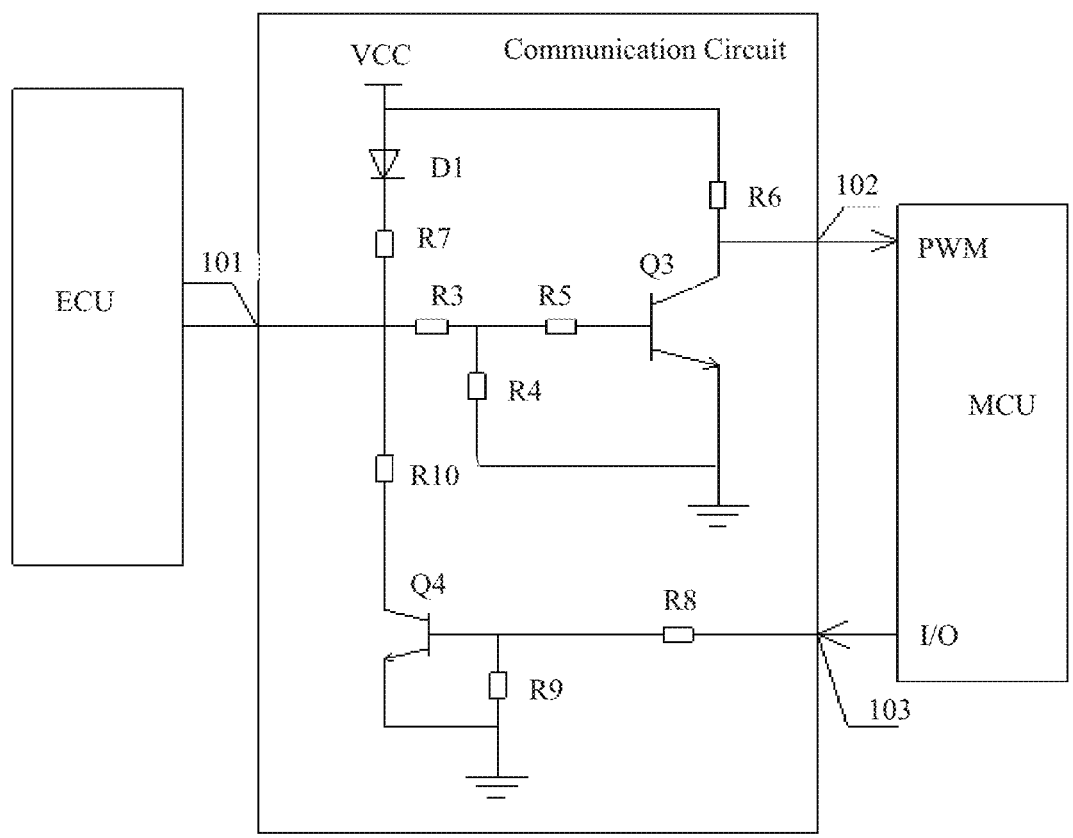
FIG. 4 is a schematic diagram showing a first connection structure of the communication circuit shown in FIG. 3 according to an embodiment.

In this embodiment, the control system further includes a communication circuit. The communication circuit may be arranged between the master controller ECU and the microprocessor MCU or integrated in the second communication module. The communication circuit includes a sending unit and a feedback unit. The sending unit is a part of the sending system. The feedback unit is a part of the feedback system. Referring to FIG. 4, the communication circuit includes a wide range voltage inputting module, a first connection terminal 101, a second connection terminal 102 and a third connection terminal 103. The first connection terminal 101 is connected to the master controller ECU. The second connection terminal 102 and the third connection terminal 103 are connected to the microprocessor MCU. The wide range voltage inputting module is arranged near the first connection terminal 101.

The control signal is inputted to the communication circuit via the wide range voltage inputting module, so that the wide range voltage inputting module always outputs a voltage of 0V when being inputted with any voltages ranging from 0V to 2.5V, which is advantageous to avoid influence on the PWM signal due to voltage fluctuation.

Reference is made to FIG. 4, which is a schematic diagram showing a first connection structure of the communication circuit. The sending unit includes a third resistor R3, a fourth resistor R4, a fifth resistor R5 and a third transistor Q3. The wide range voltage inputting module includes the third resistor R3 and the fourth resistor R4 which are connected in series with each other. The wide range voltage input function is achieved by setting resistances of the third resistor R3 and the fourth resistor R4. The signal line BUS is connected to the first connection terminal 101. The control signal is divided via the third resistor R3 and the fourth resistor R4, and then is connected to a base of the third transistor Q3 via the fifth resistor R5 to control the third transistor Q3 to be switched on or switched off, so as to control the second connection terminal 102 to send or not send the first control signal to a PMW pin of the microprocessor MCU. The sending unit further includes a sixth resistor R6. The sixth resistor R6 serves as a pull-up resistor for the collector of the third transistor Q3. A power supply VCC supplies power to the third transistor Q3 via the sixth resistor R6.

The third resistor R3 and the fourth resistor R4 forms the wide range voltage inputting module to operate as follows. In a case that the control signal is in a low level, a voltage of the low level ranges from 0 to 2V. The control signal is transmitted to the base of the third transistor Q3 after being divided by the third resistor R3 and the fourth resistor R4. By configuring the divided voltage to the base of the third transistor Q3 to be less than a turn-on voltage of the third transistor Q3, the third transistor Q3 is controlled to be in an off state. In this case, the collector of the third transistor Q3 outputs a high level, achieving the wide range voltage input function for the low level of the control signal.

The sending unit operates as follows. In a case that the control signal is in a high level, a voltage of the high level ranges from 7V to 20V. The control signal is transmitted to the base of the third transistor Q3 after being divided by the third resistor R3 and the fourth resistor R4. In a case that the divided voltage to the base of the third transistor Q3 is greater than the turn-on voltage of the third transistor Q3, the third transistor Q3 is in an on state. In this case, the collector of the third transistor Q3 outputs a low level, that is, the outputted first control signal is 0. In a case that the voltage of the base of the third transistor Q3 is less than the turn-on voltage of the third transistor Q3, the third transistor Q3 is in the off state, and the collector of the third transistor Q3 outputs a high level, that is, the outputted first control signal is in a high level.

The communication circuit further includes a seventh resistor R7 and a diode D1. The seventh resistor R7 severs as a pull-up resistor for the output interface of the master controller ECU. The diode D1 is configured to prevent the feedback signal from being inputted to the power supply to affect the level of signals on the bus.

The microprocessor MCU includes a PWM interface and a second interface I/O. The second interface I/O is connected to the third connection terminal 103 of the communication circuit and sends the second feedback signal to the third connection terminal 103. The feedback unit includes an eighth resistor R8, a ninth resistor R9, a tenth resistor R10 and a fourth transistor Q4. The eighth resistor R8 is a current limiting resistor. The ninth resistor R9 severs as a pull-down resistor for a base of the fourth transistor Q4. The tenth resistor R01 severs as a pull-up resistor for a collector of the fourth transistor Q4. The power supply VCC supplies power to the fourth transistor Q4 via the tenth resistor R10.

The feedback system operates as follows. In a case that the second feedback signal is in a high level, the fourth transistor Q4 is in an on state, the signal outputted to the signal line BUS is in a low level. In a case that the second feedback signal is in a low level, the fourth transistor Q4 is in an off state, and the signal outputted to the signal line BUS is in a high level.

Figure 5:
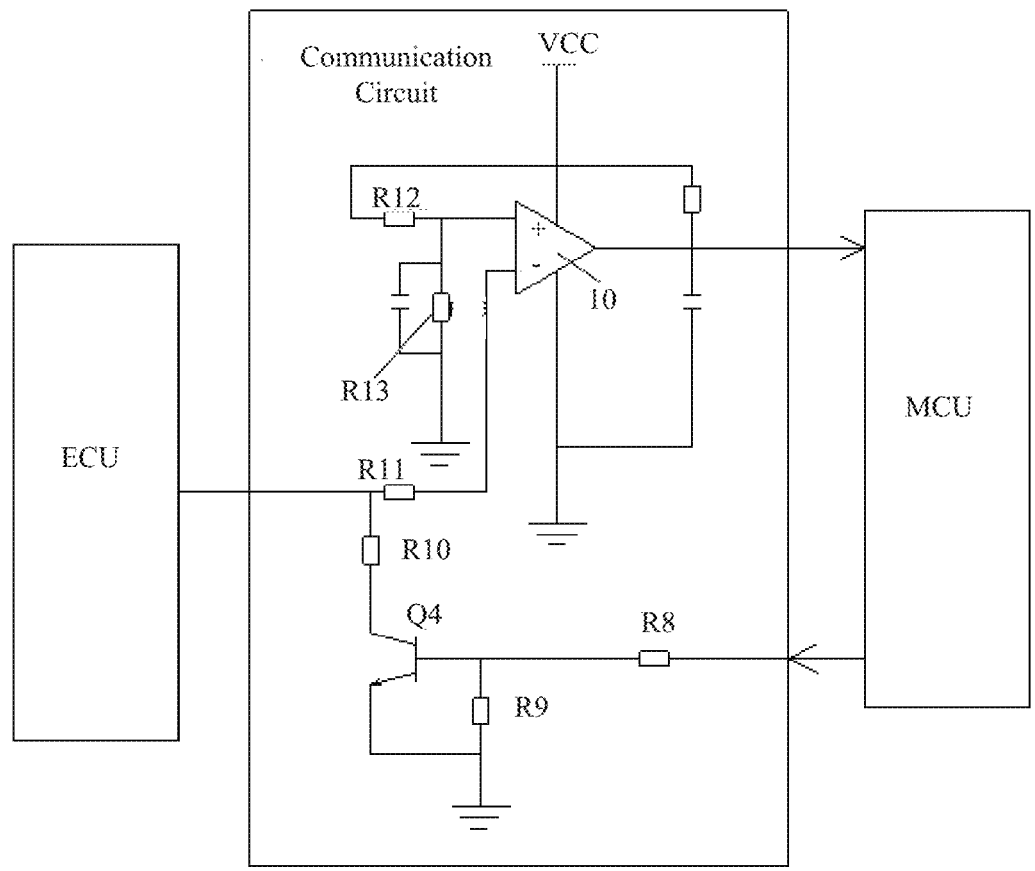
FIG. 5 is a schematic diagram showing a second connection structure of the communication circuit shown in FIG. 3 to an embodiment.

FIG. 5 is a schematic diagram showing a second connection structure of the communication circuit. Compared with the first connection structure of the communication circuit, the feedback unit in the second connection structure is same as that in the first embodiment. The sending unit includes a comparator 10, an eleventh resistor R11, a twelfth resistor R12 and a thirteenth resistor R13. The comparator 10 includes a positive terminal + and a negative terminal −. The twelfth resistor R12 and the thirteenth resistor R13 are voltage division resistors and generate an inputted reference voltage Vi. The twelfth resistor R12 is connected to the positive terminal +. That is, the inputted reference voltage Vi is connected to the positive terminal +. The control signal is connected to the negative terminal − of the comparator via the eleventh resistor R11. The eleventh resistor R11 is a current limiting resistor. In a case that that the inputted control signal is greater than the inputted reference voltage Vi, the comparator outputs a low level. In a case that that the inputted control signal is less than the inputted reference voltage Vi, the comparator outputs a high level. By configuring the inputted reference voltage Vi as 2.5V, a wide range voltage ranging from 0 to 2.5V is achieved.

Figure 6:
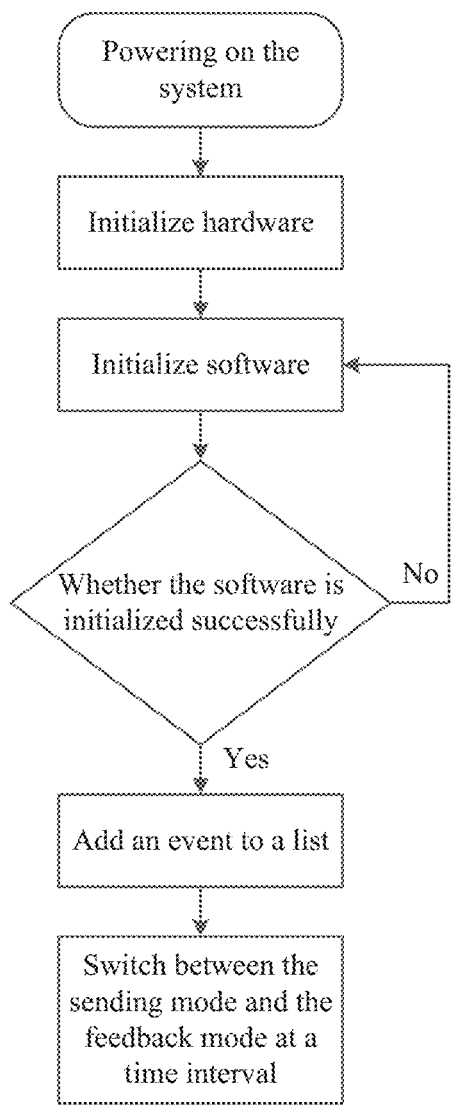
FIG. 6 is a flowchart showing a control flow performed by a control system.
Figure 7:
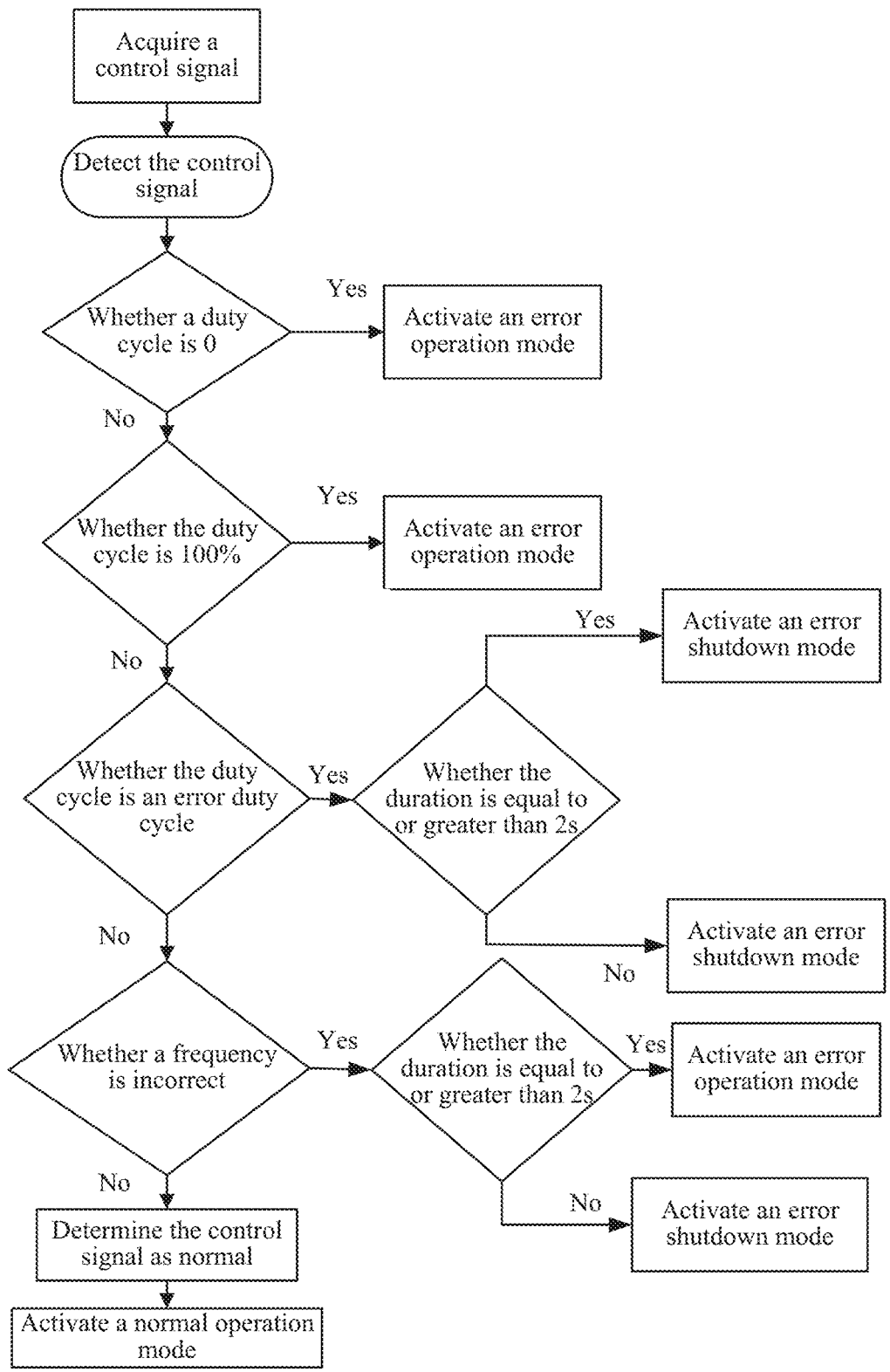
FIG. 7 is a flowchart showing a sending mode shown in FIG. 6.
Figure 8:
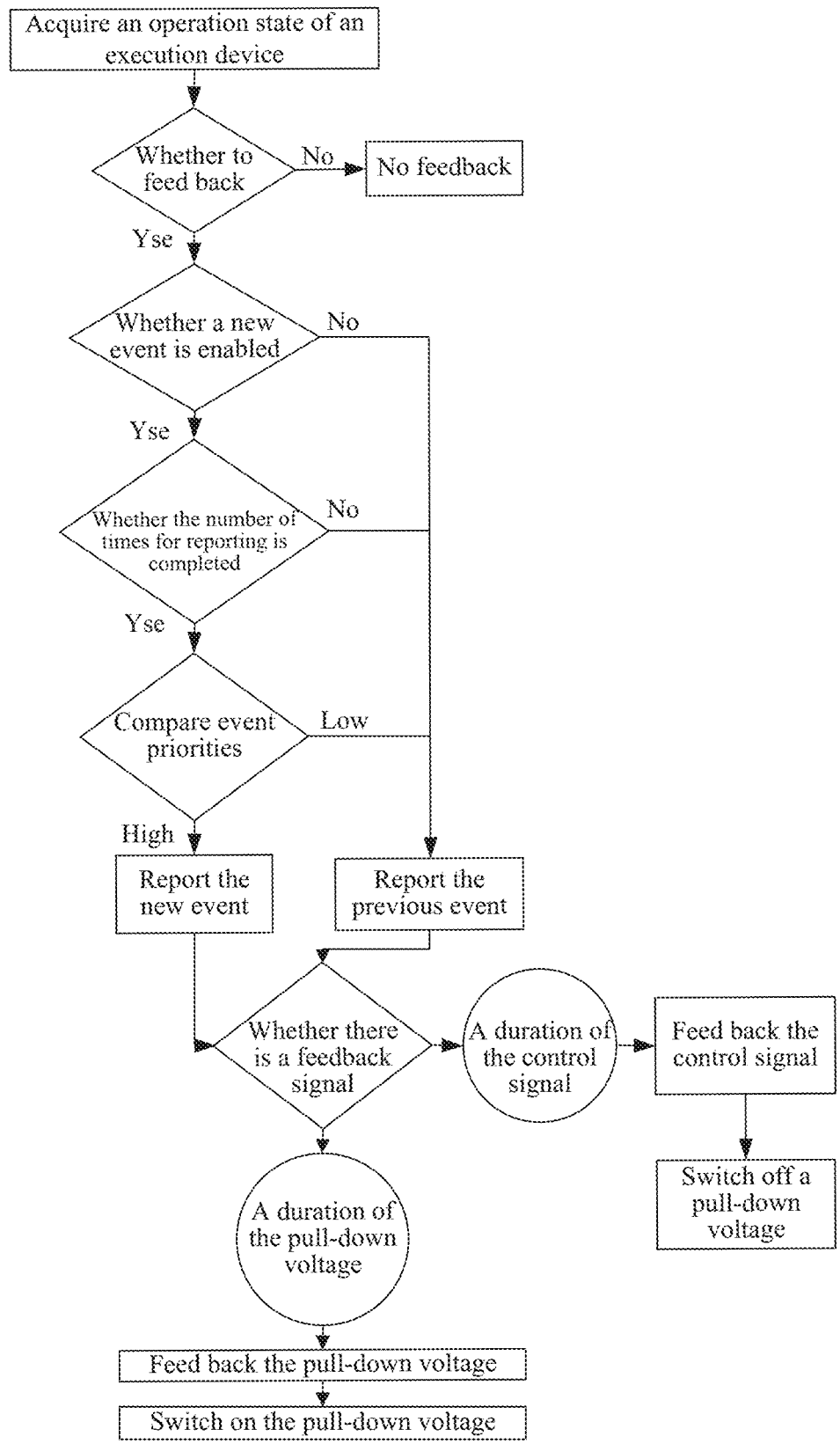
FIG. 8 is a flowchart showing a feedback mode shown in FIG. 6.

Referring to FIGS. 6 to 8, the control method includes a power-on step for the control system. The master controller sends a control signal of a PWM waveform with a duty cycle. The duty cycle represents a target rotating speed of the execution device. The microprocessor receives the control signal, analyzes the control signal, and generates the driving signal to drive the execution device to operate. The communication method further includes an event processing step. An event list is prestored for the event processing step. The event list includes multiple pieces of event information representing event states. The event information in the event list is determined to be reported or not reported via a preset program. The microprocessor acquires the current operation state of the execution device at a time interval. In a case that the current operation state is same as the event state corresponding to one of pieces of event information in the event list, the microprocessor determines to report or not report the piece of event information in the event list and feeds back to the master controller.

The event information includes an event number, event feedback information and an enable bit. Each event number corresponds to an operation state of the execution device. The event feedback information includes a combination of a high voltage and a low voltage, which is generated corresponding to the current operation state of the execution device and fed back to the master controller. In a case that the enable bit is 1, the event information is reported. In a case that the enable bit is 0, the event information is not reported.

The event information further includes an event priority and an event feedback times. In a case that the microprocessor acquires multiple current operation states of the execution device at a same time, a piece of event information with a higher priority is fed back to the master controller prior to a piece of event information with a lower priority. The event feedback times indicates a minimum number of times of feeding back the event information to the master controller.

The control method further includes an initialization step for the control system. The initialization step includes a hardware initialization, a software initialization, and adding the event information to form the event list. The initialization step is performed after the power-on step. The adding the event information is performed after software initialization is performed.

The control method further includes a state machine processing step. The state machine processing step is performed after the master controller sends the control signal. The state machine processing step includes: acquiring, at a time interval, the control signal; determining a state of the control signal; and activating an operation mode based on the state of the control signal.

The operation mode includes a normal operation mode, an error shutdown mode and an error operation mode. In the normal operation mode, the microprocessor generates a drive signal to drive the execution device to operate at a target rotating speed. In the error operation mode, the microprocessor generates a drive signal to drive the execution device to operate at a maximum rotating speed. In the error shutdown mode, the microprocessor stops sending the drive signal to the execution device to cause the execution device to maintain the operation state.

The state of the control signal includes the control signal having a correct duty cycle and a correct frequency, and the control signal having an incorrect duty cycle and/or an incorrect frequency. In a case that the control signal has the correct duty cycle and the correct frequency, the state machine processing step is performed in the normal operation mode. In a case that the control signal has an incorrect duty cycle and/or an incorrect frequency, the state machine processing step is performed in the error shutdown mode or the error operation mode.

The incorrect duty cycle includes a 0 duty cycle and a 100% duty cycle, in which case the state machine processing step is performed in the error operation mode. The incorrect duty cycle further includes an error duty cycle. The error duty cycle includes a case that, in 6 successive control signals of the PWM waveform inputted to the microprocessor, a difference between a maximum of the duty cycle and a minimum of the duty cycle is greater than 1%, and a duration of this situation is equal to or greater than 2 s. In this case, the state machine processing step is performed in the error operation mode. The error duty cycle further includes a case that, in 6 successive control signals of the PWM waveform inputted to the microprocessor, a difference between a maximum of the duty cycle and a minimum of the duty cycle is greater than 1%, and a duration of this situation is greater than 1 s and less than 2 s. In this case, the state machine processing step is performed in the error shutdown mode.

The frequency being incorrect includes a case that, in 6 successive control signals of the PWM waveform inputted to the microprocessor, a ratio of a difference between a maximum of the frequency and a minimum of the frequency to the maximum of the frequency is greater than 1%, and a duration of this situation is greater than a equal to 2 s. In this case, the state machine processing step is performed in the error operation mode. The frequency being incorrect further includes a case that, in 6 successive control signals of the PWM waveform through the microprocessor, a ratio of a difference between a maximum of the frequency and a minimum of the frequency to the maximum of the frequency is greater than 1%, and a duration of this situation is greater than 1 s and less than 2 s. In this case, the state machine processing step is performed in the error shutdown mode.

In this embodiment, functions of the master controller and the microprocessor are described in terms of modules and sub-modules.

It should be noted that, the above embodiments are described only to illustrate but not intended to limit the technical solutions of the present disclosure. Although the technical solutions is described in detail with reference to the above embodiments, it should be understood by those skilled in the art that, various modifications and equivalents can be made to the technical solutions of the present disclosure without departing from the spirit and scope of the present disclosure, all of which should be contained within the scope of the claims of the present disclosure.

The invention claimed is:

1. A control system for controlling operation of an execution device, the control system comprising:
   a master controller;
   a microprocessor; and
   a signal line; wherein
   the master controller is configured to send a control signal to the microprocessor via the signal line;
   the microprocessor is configured to: send the control signal to the execution device to drive the execution device to operate; acquire, at a time interval, a feedback signal representing an operation state of the execution device; and send the feedback signal to the signal line; and
   the master controller is further configured to: acquire the feedback signal from the signal line; determine, from the feedback signal, the operation state of the execution device; and regulate the control signal based on the operation state;

wherein the first control module comprises a first storage module configured to prestore a first combination list, wherein the first combination list comprises a plurality of combinations of a duration of the control signal and a duration of a low level signal;

the third feedback signal is a combination of a duration of the control signal and a duration of the low level signal; and the master controller is configured to: determine the operation state of the execution device based on whether the third feedback signal is same as one of the plurality of combinations of the duration of the control signal and the duration of the low level signal in the first combination list and regulate the control signal based on the operation state.

2. The control system according to claim 1, wherein the master controller comprises a first communication module and a first control module;

the microprocessor comprises a second communication module and a second control module;

the master controller is configured to send the control signal to the second communication module via the signal line;

the second communication module is configured to convert the control signal into a first control signal;

the second control module is configured to: acquire the first control signal, convert the first control signal into a second control signal, and send the second control signal to the execution device; and acquire, at a time interval, a first feedback signal representing the operation state of the execution device, convert the first feedback signal into a second feedback signal;

the second communication module is configured to convert the second feedback signal into a third feedback signal and send the third feedback signal to the signal line; and the master controller is further configured to: acquire the third feedback signal; determine, from the third feedback signal, the operation state of the execution device; and regulate the control signal based on the operation state.

3. The control system according to claim 1, wherein the operation state of the execution device comprises:
a normal state indicating that the execution device operates following the control signal sent by the master controller; and
an event state indicating that the execution device operates not following the control signal sent by the master controller; and the second control module comprises a second storage module configured to prestore a list of operation states, the second control module is configured to: acquire a current operation state; determine, in a case that the current operation state is same as one of the prestored operation states, the current operation state as the prestored operation state; generate a current event information corresponding to the prestored operation state; and generate the second feedback signal including the current event information.

4. The control system according to claim 1, wherein the second communication module further includes a signal identification module configured to receive the control signal and determine whether the received control signal is a signal of a PWM waveform formed by high levels and low levels.

5. The control system according to claim 3, wherein the event state comprises a stalled state, a dry-running state, an over-temperature state, an over-voltage state, and an under-voltage state;

the stalled state and the dry-running state are determined from an acquired operation current of a motor or acquired three-phase voltages of a motor, for the stalled state and the dry-running state, the first feedback signal comprises the operation current of the motor or the three-phase voltages of the motor;

the over-temperature state is determined from a signal acquired from a temperature sensor, for the over-temperature state, the first feedback signal comprises the signal from the temperature sensor; and the over-voltage state and the under-voltage state are determined from acquired three-phase voltages of the motor, for the over-voltage state and the under-voltage state, the first feedback signal comprises the three-phase voltages of the motor.

6. The control system according to claim 3, wherein the second communication module comprises:
an event adding module configured to add event information to form an event list; and
an event storage module configured to store the event list; and the second communication module is configured to:
receive the second feedback signal;
acquire the current event information in the second feedback signal; determine to report or not report, in a case that the current event information is same as one piece of event information stored in the event storage module, the event information corresponding to the current event information;
and generate the third feedback signal.

7. The control system according to claim 4, wherein the signal identification module is further configured to determine whether a duty cycle of the control signal and a frequency of the control signal are correct;

the second communication module is configured to generate the first control signal consistent with the control signal, in a case that each of the duty cycle and the frequency is correct; and in a case that any of the duty cycle and the frequency is incorrect, the control signal is an abnormal signal, a feedback system does not operate, and the second communication module is configured to drive, via the second control module, a motor to operate at a maximum rotating speed or maintain its rotating speed.

8. The control system according to claim 6, wherein the event information in the event storage module comprises a duration of a pull-down voltage and an enable bit, wherein the duration of the pull-down voltage is the duration of the low level signal in the combination of the duration of the current control signal and the duration of the low level signal; and in a case that the enable bit is 1, the event information is reported; and in a case that the enable bit is 0, the event information is not reported.

9. The control system according to claim 7, wherein the duty cycle being incorrect comprises the duty cycle being a 0 duty cycle, a 100% duty cycle and an error duty cycle;

the error duty cycle comprises a case that in 6 successive control signals of the PWM waveform inputted to the second communication module, a difference between a maximum of the duty cycle and a minimum of the duty cycle is greater than 1%, and a duration of this situation is greater than or equal to 2s, in this case, the feedback system does not operate and the second communication module is configured to drive, via the second control module, the motor to operate at the maximum rotating speed;

the error duty cycle further comprises a case that in 6 successive control signals of the PWM waveform inputted to the second communication module, a difference between a maximum duty cycle and a minimum duty cycle is greater than 1%, and a duration of this situation is greater than 1s and less than 2s, in this case, the feedback system does not operate and the second communication module is configured to drive, via the second control module, the motor to maintain its rotating speed;

the frequency being incorrect comprises a case that in 6 successive control signals of the PWM waveform inputted to the second communication module, a ratio of the difference between a maximum of the frequency and a minimum of the frequency to the maximum frequency is greater than 1%, and a duration of this situation is greater than or equal to 2s, in this case, the feedback system does not operate and the second communication module is configured to drive, via the second control module, the motor to operate at the maximum rotating speed; and the frequency being incorrect further comprises a case that in 6 successive control signals of the PWM waveform inputted to the second communication module, a ratio of the difference between a maximum of the frequency and a minimum of the frequency to the maximum of the frequency is greater than 1%, and a duration of this situation is greater than 1s and less than 2s, in this case, the feedback system does not operate and the second communication module is configured to drive, via the second control module, the motor to maintain its rotating speed.

10. The control system according to claim 8, wherein
the event information further comprises an event number and a priority;
the event number indicates the current operation state of the execution device; and
in a case that there are a plurality of current operation states corresponding to a plurality of pieces of event information, a piece of event information having the highest priority is firstly used to generate the third feedback signal.

11. A control method performed by a control system comprising a master controller and a microprocessor, the control method comprising:
sending, by the master controller, a control signal of a PWM waveform with a duty cycle, wherein the duty cycle corresponds to a target rotating speed of an execution device;
receiving and analyzing the control signal by the microprocessor, and generating a drive signal to drive the execution device to operate;
acquiring, by the microprocessor at a time interval, a current operation state of the execution device to generate an event state;
determining, by the microprocessor, whether the current operation state of the execution device is consistent with the event state corresponding to a piece of event information in a prestored event list; and enabling or disabling, by the microprocessor, the piece of event information in the prestored event list and feeding back to the master controller, wherein the prestored event list comprises a plurality pieces of event information representing event states, wherein the event information comprises an event number, event feedback information and an event enable bit;

each event number corresponds to an operation state of the execution device;

the event feedback information comprises a combination of a high voltage and a low voltage, and the combination of the high voltage and the low voltage is fed back to the master controller; and in a case that the enable bit is 1, the event information is reported; and in a case that the enable bit is 0, the event information is not reported.

12. The control method according to claim 11, wherein the event information further comprises an event priority and an event feedback times;
in a case that the microprocessor acquires a plurality of current operation states of the execution device at a same time, a piece of event information with a higher priority is fed back to the master controller prior to a piece of event information with a lower priority; and
the event feedback times indicates a minimum number of times of feeding back the event information to the master controller.

13. The control method according to claim 11, wherein
the control method further comprises an initialization step comprising initializing hardware, initializing software, and adding event information to form the event list;
the initialization step is performed after the control system is powered on; and
the adding the event information is performed after initializing the hardware and initializing the software.

14. The control method according to claim 13, wherein
after the master controller sends the control signal, the control method further comprises a state machine processing step, the state machine processing step comprises:
acquiring, at a time interval, the control signal;
determining a state of the control signal; and
activating an operation mode based on the state of the control signal.

15. The control method according to claim 14, wherein
the operation mode comprises a normal operation mode, an error shutdown mode and an error operation mode;
in the normal operation mode, the microprocessor generates a drive signal driving the execution device to operate at the target rotating speed;
in the error operation mode, the microprocessor generates a drive signal driving the execution device to operate at a maximum rotating speed; and
in the error shutdown mode, the microprocessor stops sending a drive signal to the execution device to cause the execution device to maintain its operation state.

16. The control method according to claim 15, wherein
the state of the control signal comprises the control signal having a correct duty cycle and a correct frequency, and the control signal having an incorrect duty cycle and/or an incorrect frequency;
in a case that the control signal has a correct duty cycle and a correct frequency, the state machine processing step is performed in the normal operation mode; and
in a case that the control signal has an incorrect duty cycle and/or an incorrect frequency, the state machine processing step is performed in the error shutdown mode or the error operation mode.

17. The control method according to claim 16, wherein
the incorrect duty cycle comprises the duty cycle being a 0 duty cycle and the duty cycle being a 100% duty cycle, in which case the state machine processing step is performed in the error operation mode; and
the incorrect duty cycle further comprises an error duty cycle,
the error duty cycle comprises a case that, in 6 successive control signals of the PWM waveform inputted to the microprocessor, a difference between a maximum of the duty cycle and a minimum of the duty cycle is greater than 1%, and a duration of this situation is greater than is or equal to 2s, in this case, the state machine processing step is performed in the error operation mode; and
the error duty cycle further comprises a case that, in the 6 successive control signals of the PWM waveform inputted to the microprocessor, a difference between a maximum of the duty cycle and a minimum of the duty cycle is greater than 1%, and a duration of this situation is greater than 1s and less than 2s, in this case, the state machine processing step is performed in the error shutdown mode.

18. The control method according to claim 16, wherein
the incorrect frequency comprises a case that, in 6 successive control signals of the PWM waveform inputted to the microprocessor, a ratio of a difference between a maximum of the frequency and a minimum of the frequency to the maximum of the frequency is greater than 1%, and a duration of this situation is greater than or equal to 2s, in this case, the state machine processing step is performed in the error operation mode; and
the incorrect frequency further comprises a case that, in 6 successive control signals of the PWM waveform inputted to the microprocessor, a ratio of a difference between a maximum of the frequency and a minimum of the frequency to the maximum of the frequency is greater than 1%, and a duration of this situation is greater than is and less than 2s, in this case, the state machine processing step is performed in the error shutdown mode.

* * * * *

UNITED STATES PATENT AND TRADEMARK OFFICE
CERTIFICATE OF CORRECTION

PATENT NO. : 10,989,187 B2
APPLICATION NO. : 16/348140
DATED : April 27, 2021
INVENTOR(S) : Shuang Li et al.

Page 1 of 1

It is certified that error appears in the above-identified patent and that said Letters Patent is hereby corrected as shown below:

In the Claims

At Column 15, Line 16, the phrase "greater than is" should read -- greater than 1s --

At Column 16, Line 19, the phrase "greater than is" should read -- greater than 1s --

Signed and Sealed this
Eighth Day of June, 2021

Drew Hirshfeld
*Performing the Functions and Duties of the
Under Secretary of Commerce for Intellectual Property and
Director of the United States Patent and Trademark Office*